United States Patent
Belopolsky et al.

[11] Patent Number: 5,915,993
[45] Date of Patent: Jun. 29, 1999

[54] ASSEMBLY CONTAINING A MODULAR JACK AND A LIGHT EMITTING DIODE

[75] Inventors: Yakov Belopolsky, Harrisburg; Lee W. Potteiger, Lewisberry, both of Pa.

[73] Assignee: Berg Technology, Inc., Reno, Nev.

[21] Appl. No.: 08/808,514

[22] Filed: Feb. 27, 1997

[51] Int. Cl.[6] .................................................. H01R 3/00
[52] U.S. Cl. .................................................. 439/490; 439/676
[58] Field of Search .............................. 439/79, 488–490, 439/620, 676, 55, 56, 607

[56] References Cited

U.S. PATENT DOCUMENTS

| | | |
|---|---|---|
| 4,065,198 | 12/1977 | Jordan . |
| 4,193,653 | 3/1980 | Aizawa . |
| 4,379,606 | 4/1983 | Clark et al. . |
| 4,978,317 | 12/1990 | Pecrass ................................. 439/490 |
| 5,062,807 | 11/1991 | Guss, III .............................. 439/736 X |
| 5,613,873 | 3/1997 | Bell, Jr. et al. ......................... 439/490 |

FOREIGN PATENT DOCUMENTS

| | | |
|---|---|---|
| 0 365 698 A1 | 10/1988 | European Pat. Off. . |
| 0 315 705 | 5/1989 | European Pat. Off. . |
| 0 740 370 A1 | 4/1996 | European Pat. Off. . |

*Primary Examiner*—Khiem Nguyen
*Attorney, Agent, or Firm*—Daniel J. Long; M. Richard Page

[57] ABSTRACT

An assembly comprising a printed circuit board (PCB) having opposed first and second planar surfaces; a light emitting diode (LED) fixed to said PCB; a jack fixed to one of said planar surfaces of the PCB and comprising an insulative housing comprising first and second longitudinal walls positioned such that said second longitudinal wall is positioned over said first and second longitudinal wall in spaced parallel relation and at least one pair of lateral walls is interposed between the first and second longitudinal walls to form at least one traverse plug receiving cavity extending from a substantially open front side of said jack to a rear side of said jack; and a lens positioned adjacent the front side of the jack which conveys or diffracts light from the LED. Relatively little interference with signals provided to the connector results from an LED mounted in this way.

14 Claims, 8 Drawing Sheets

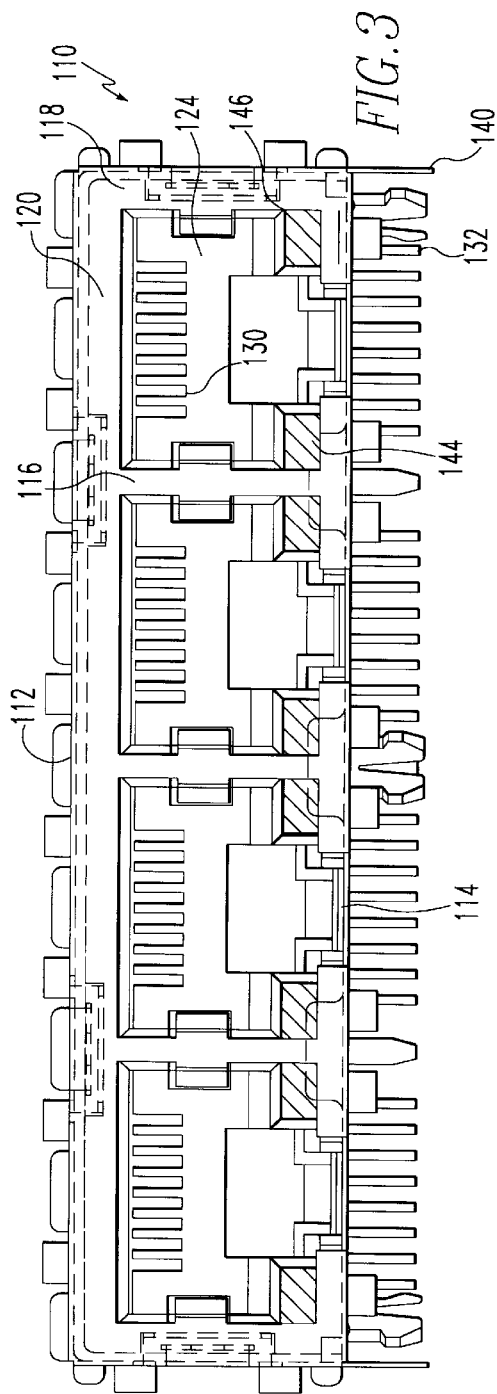
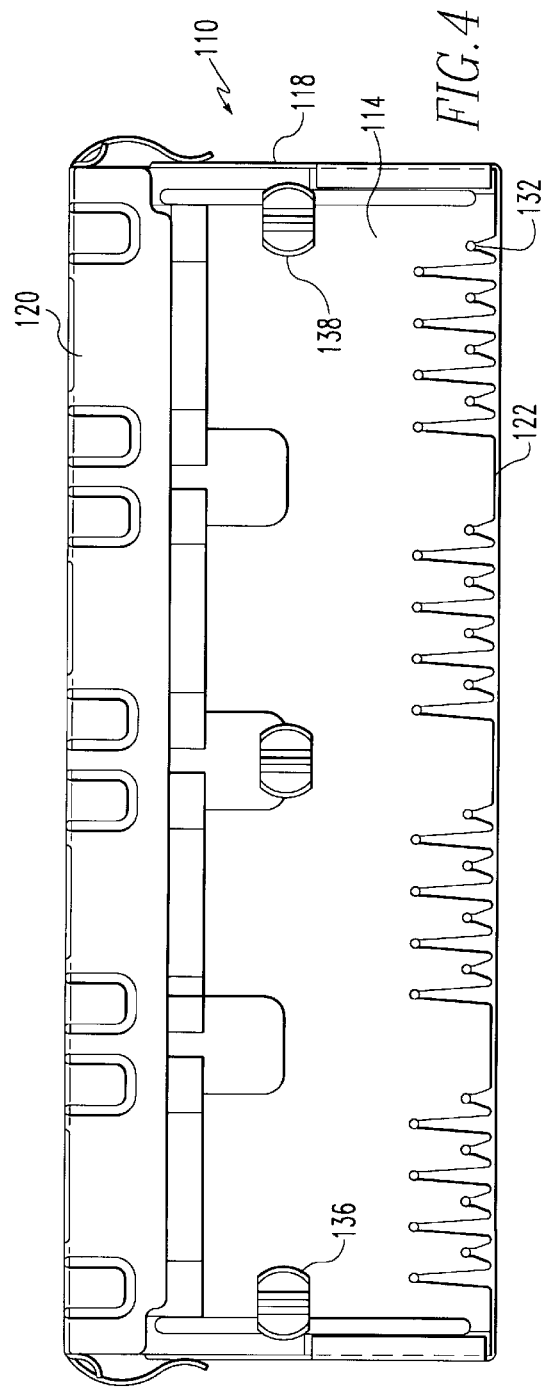

ASSEMBLY CONTAINING A MODULAR JACK AND A LIGHT EMITTING DIODE

BACKGROUND OF THE INVENTION

1. Field of the Invention

The present invention relates to electrical connectors and more particularly to electrical connectors including indicator means for showing the status of the connector.

2. Brief Description of Prior Developments

The prior art discloses various ways in which the status of electrical connectors may be indicated. A light emitting diode (LED) may be employed on the connector to show that it is engaged with its mating part, that a signal is being provided to the connector or that the connector is available for use. One disadvantage to using an LED on the connector is that the use of the LED may result in an undesirable amount of noise which may interfere with signals provided to the connector.

A need, therefore, exists for a modular jack which may make use of an LED without receiving an undesirable amount of noise from that LED.

SUMMARY OF THE INVENTION

The present invention is an assembly which includes a printed circuit board (PCB) having opposed first and second planar surfaces. At least one light emitting means such as an LED fixed to said PCB. A jack is fixed to one of said planar surfaces of the PCB. This jack comprises an insulative housing comprising first and second longitudinal walls positioned such that said second longitudinal wall is positioned over said first longitudinal wall in spaced parallel relation and at least one pair of lateral walls is interposed between the first and second longitudinal walls to form at least one traverse plug receiving cavity extending from a substantially open front side of said jack to a rear side of said jack. A light conducting means which is preferably a light is positioned adjacent the front side of the jack.

BRIEF DESCRIPTION OF THE DRAWINGS

The assembly and modular jack of the present invention are further described with reference to the accompanying drawings in which:

FIG. 3 is a front elevational view of a modular jack representing another preferred embodiment of the present invention;

FIG. 4 is a bottom plan view of the modular jack shown in FIG. 3;

DETAILED DESCRIPTION OF THE PREFERRED EMBODIMENTS

Figure 1:
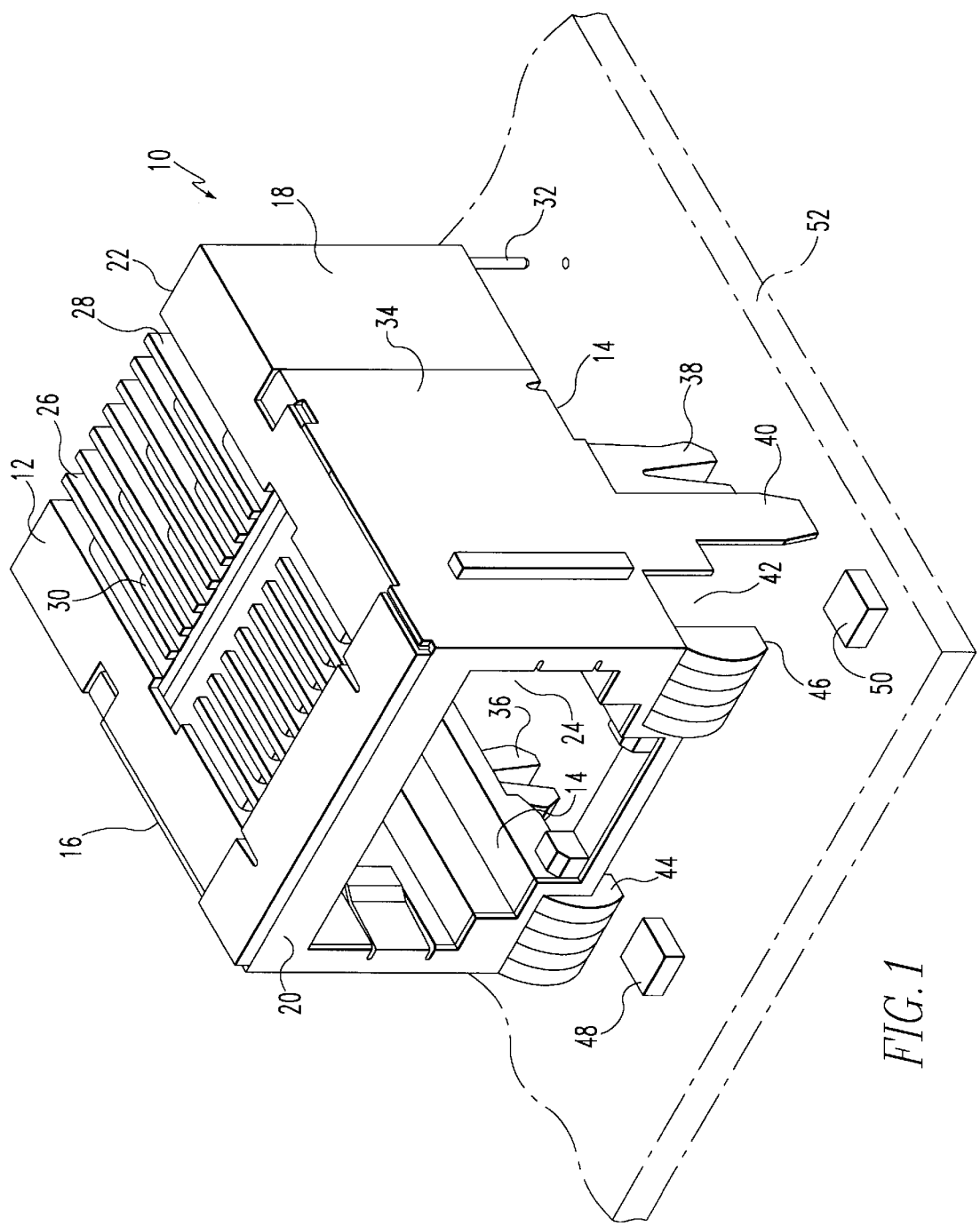
FIG. 1 is an exploded perspective view of an assembly comprised of a modular jack, PCB and LED which represents a preferred embodiment of the present invention.
Figure 2:
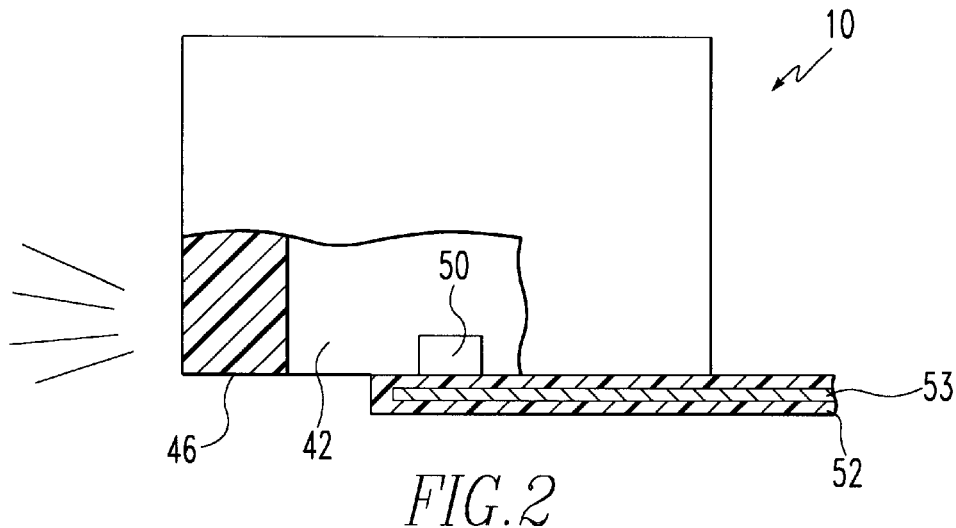
FIG. 2 is a schematic side view of the assembly shown in FIG. 1.

Referring to FIGS. 1–2, a modular jack is shown generally at numeral 10. This modular jack has an insulative housing which includes a top wall 12, a bottom wall 14, lateral walls 16 and 18, a front side 20 and a rear side 22. From the open front side 20 there is an insert receiving cavity 24 where the jack may be engaged by an insert as is shown, for example, in U.S. Pat. No. 5,456,619, the contents of which are incorporated by reference. On the top wall there are a number of conductor receiving grooves as at groove 26 and 28 which receive conductors such as wires 30 and 32. These wires extend upwardly parallel to the rear side then extend horizontally in the grooves in the top wall and from the front of the top wall extend downwardly and rearwardly into the cavity 24. The modular jack also includes a metallic shield 34 and mounting pins as at pins 36 and 38. There is also an additional downwardly extending mounting metallic projection 40 on shield 34 and an adjacent cavity 42 in the lateral wall 18. Another similar cavity (not shown) is in the lateral wall 16. At the front of these cavities there are, respectively, lenses 44 and 46 which are fixed to the housing by adhesive, heat welding or any other suitable means well known to those skilled in the art. LED 48 and LED 50 are mounted on PCB 52. The PCB also includes a conventional metallized medial shield plane 53. As is shown particularly in FIG. 2, LED 50 fits in cavity 42. Light from LED 50 is refracted by lens 46 so that the user is apprised of some status of the jack. Similarly, light from LED 48 is refracted through lens 44. Appropriate circuitry is provided on the PCB to cause LED's 48 and/or 50 to emit light under certain status conditions.

Figure 5:
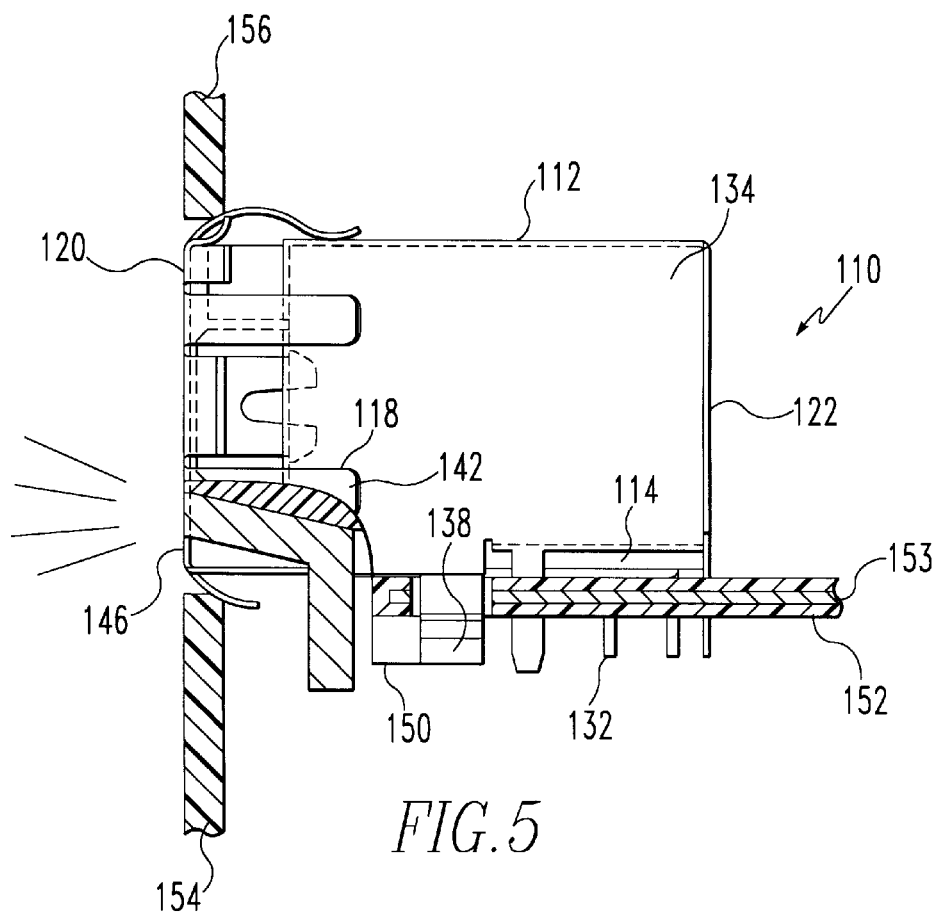
FIG. 5 is a end view of an assembly including the modular gang jack shown in FIG. 3 along with the PCB and LED.

Referring to FIGS. 3–5, another preferred embodiment is represented by a modular gang jack which is shown generally at numeral 110. This modular jack has an insulative housing which includes a top wall 112, a bottom wall 114, lateral walls 116 and 118, a front side 120 and a rear side 122. From the open front side 120 there are a number of insert receiving cavities as at insert receiving cavity 124 where the jack may be engaged by an insert. The modular jack also includes a metallic shield 134 and mounting pins as at pins 136 and 138. Under a shield on the top wall there are a number of conductor receiving grooves (not shown) which receive conductors such as wires 130 and 132. These wires extend upwardly parallel to the rear side then extend horizontally in the grooves in the top wall and from the front of the top wall extend downwardly and rearwardly into the cavity 124. There is also an additional downwardly extending mounting projection 140 from the shield and an adjacent cavity 142 in the lateral wall 118. Another similar cavity (not shown) is in the lateral wall 116 and in each of the other lateral walls. At the front of these cavities there are, respectively, lenses 144 and 146. LED 150 is mounted on the bottom surface of PCB 152. The PCB includes a metallized medial shield plane 153. As is shown particularly in FIG. 5, LED 150 fits in cavity 152. Light from LED 150 is refracted by lens 146 so that the user is informed of some status of the jack. It will also be seen that the jack is interposed between two panel sections 154 and 156.

Figure 6:
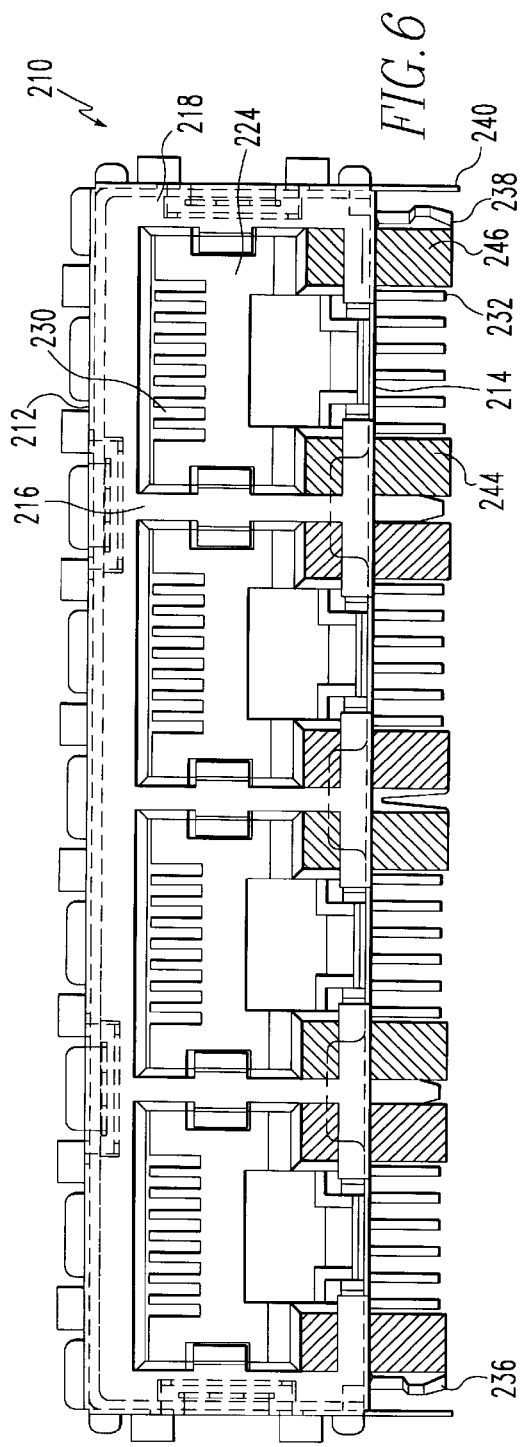
FIG. 6 is a front elevational view of a modular gang jack representing another preferred embodiment of the present invention.
Figure 7:
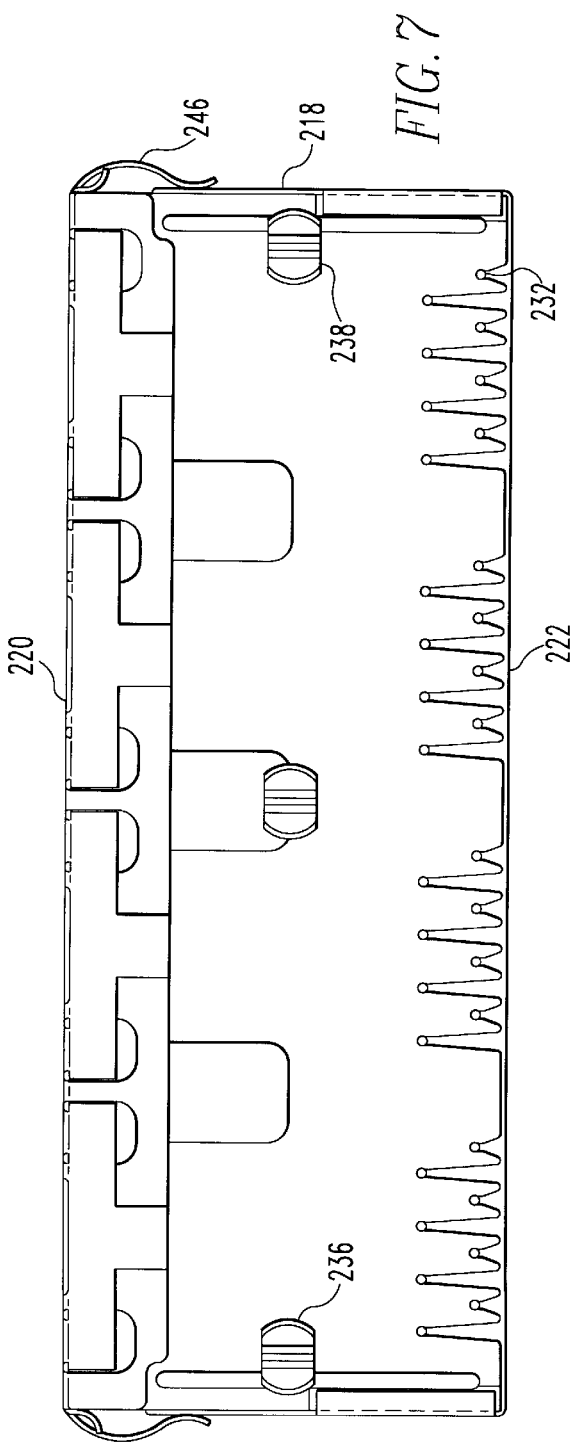
FIG. 7 is a bottom plan view of the modular gang shown in FIG. 6.
Figure 8:
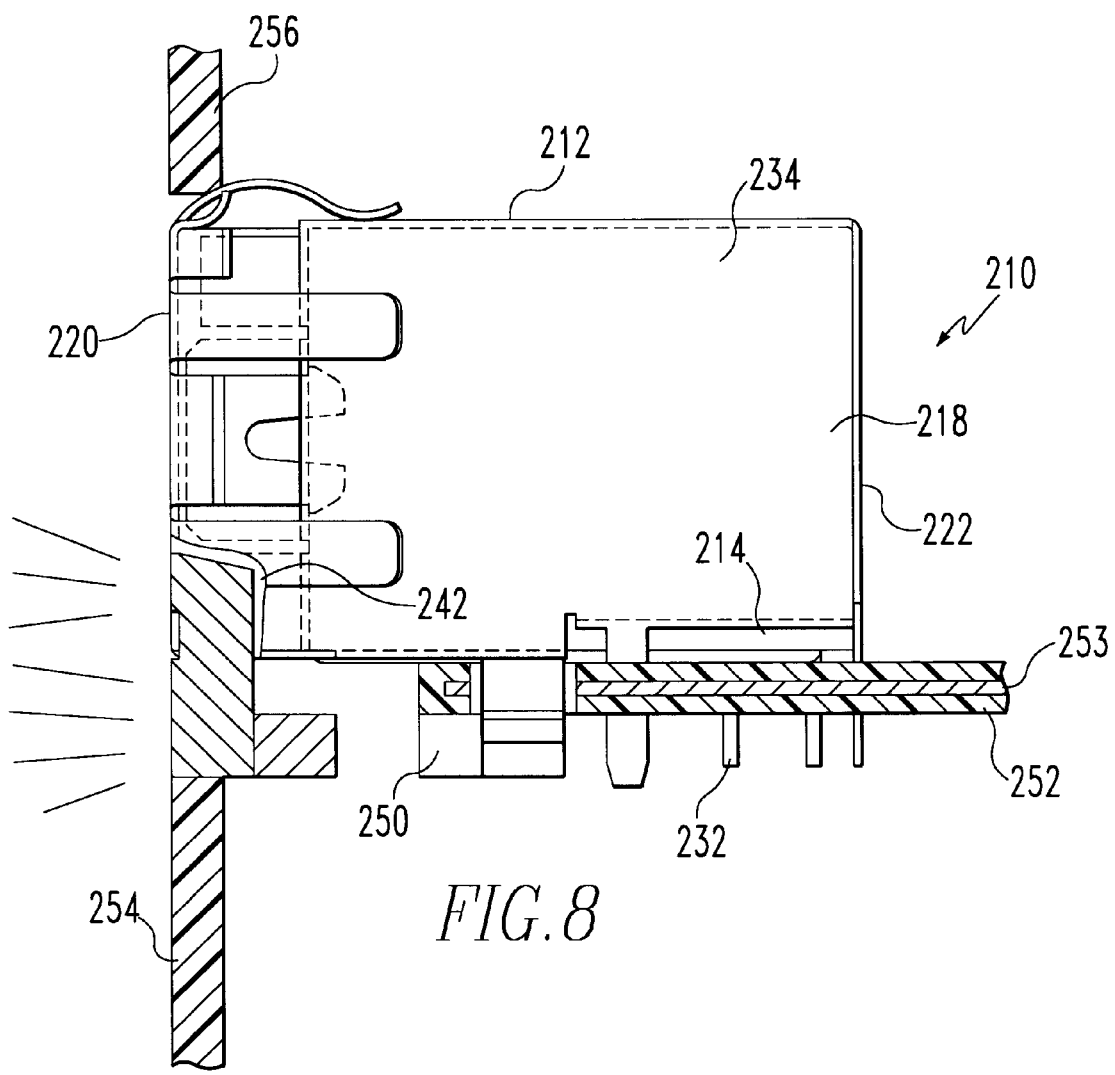
FIG. 8 is a modular jack representing still another alternative preferred embodiment of the present invention.

Referring to FIGS. 6–8, another preferred embodiment is repressed by a modular jack which is shown generally at numeral 210. This modular jack has an insulative housing which includes a top wall 212, a bottom wall 214, lateral walls 216 and 218, a front side 220 and a rear side 222. From the open front side 220 there are a plurality of insert receiving cavity such as insert receiving cavity 224 where the jack may be engaged by an insert. Under the shield on the top wall there are a number of conductor receiving grooves (not shown) which receive conductors such as wires 230 and 232. These wires extend upwardly parallel to the rear side then extend horizontally in the grooves in the top wall and from the front of the top wall extend downwardly and rearwardly into the cavity 224. The modular jack also includes a metallic shield 234 and mounting pins as at pins 226 and 228. There is also an additional downwardly extending shield mounting projection 240 and an adjacent cavity 242 in the lateral wall 218. Another similar cavity (not shown) is in the lateral wall 216 and in each of the other lateral walls. At the front of these cavities there are, respectively, lenses 244 and 246 which are fixed to the housing. LED 248 is mounted on the bottom surface of PCB 252. As is shown particularly in FIG. 8, LED 250 fits in cavity 252. The PCB also includes a conventional metallized medial shield plane 253. Light from LED 250 is refracted or conducted by lens 246 so that the user is apprised of some status of the jack. It will also be seen that section lens 246 is superimposed on a panel 254 and above the jack there is another panel section 256.

Figure 9:
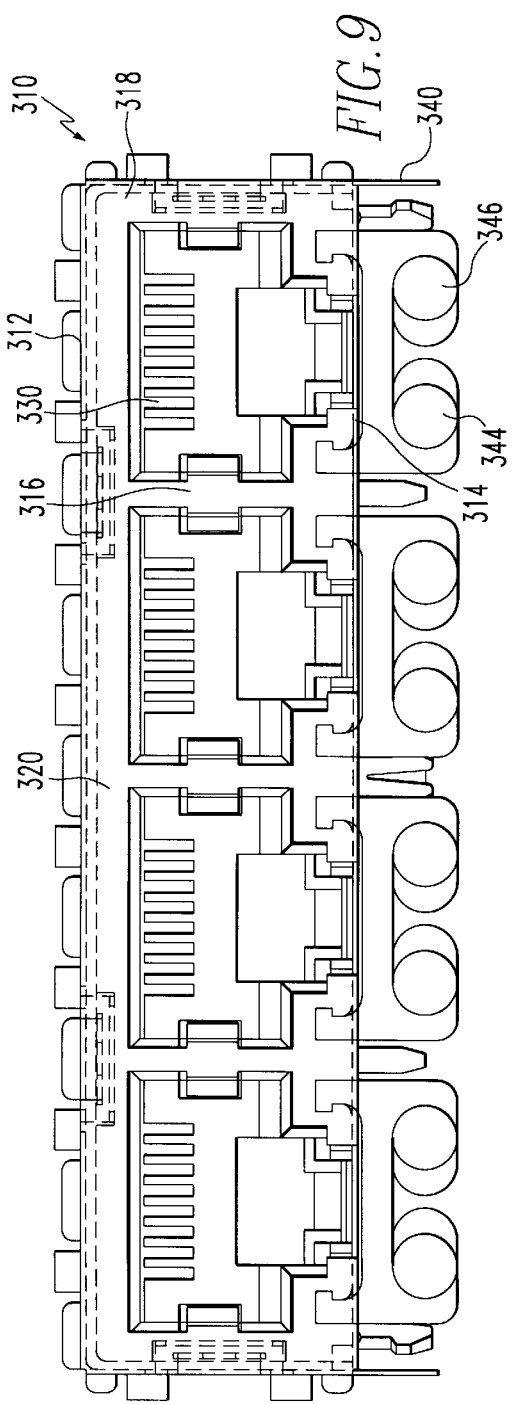
FIG. 9 is a front elevational view of a modular gang jack representing still another preferred embodiment of the present invention.
Figure 10:
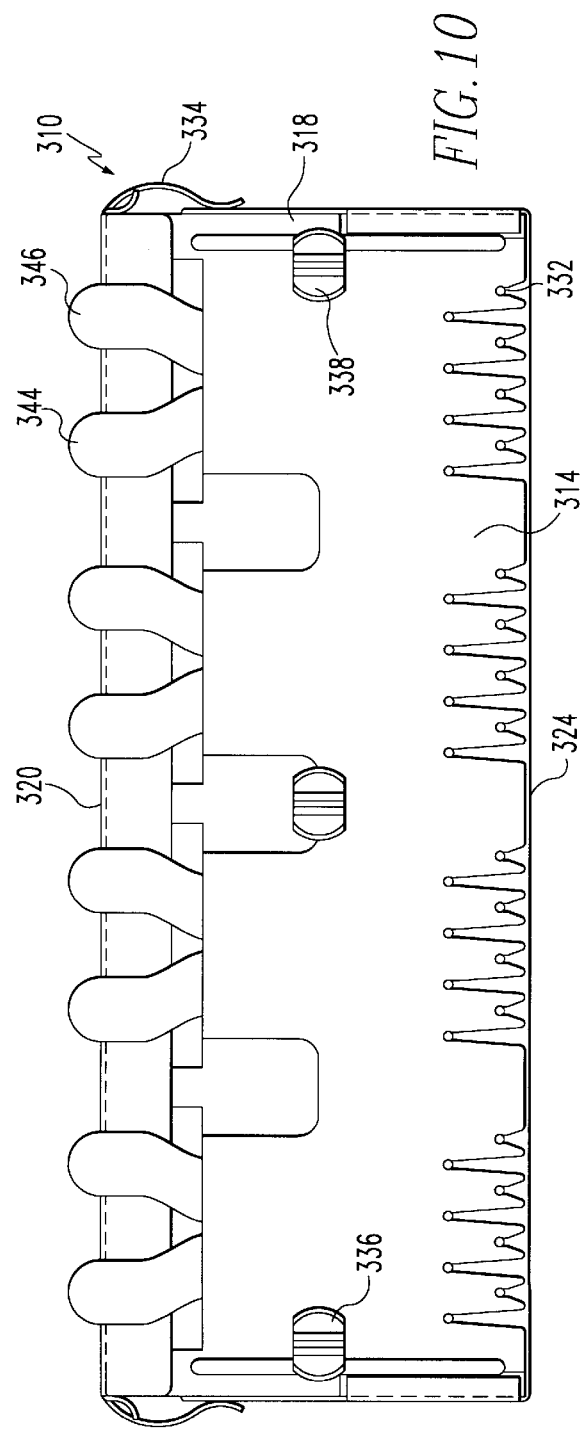
FIG. 10 is bottom plan view of the modular gang jack shown in FIG. 9.
Figure 11:
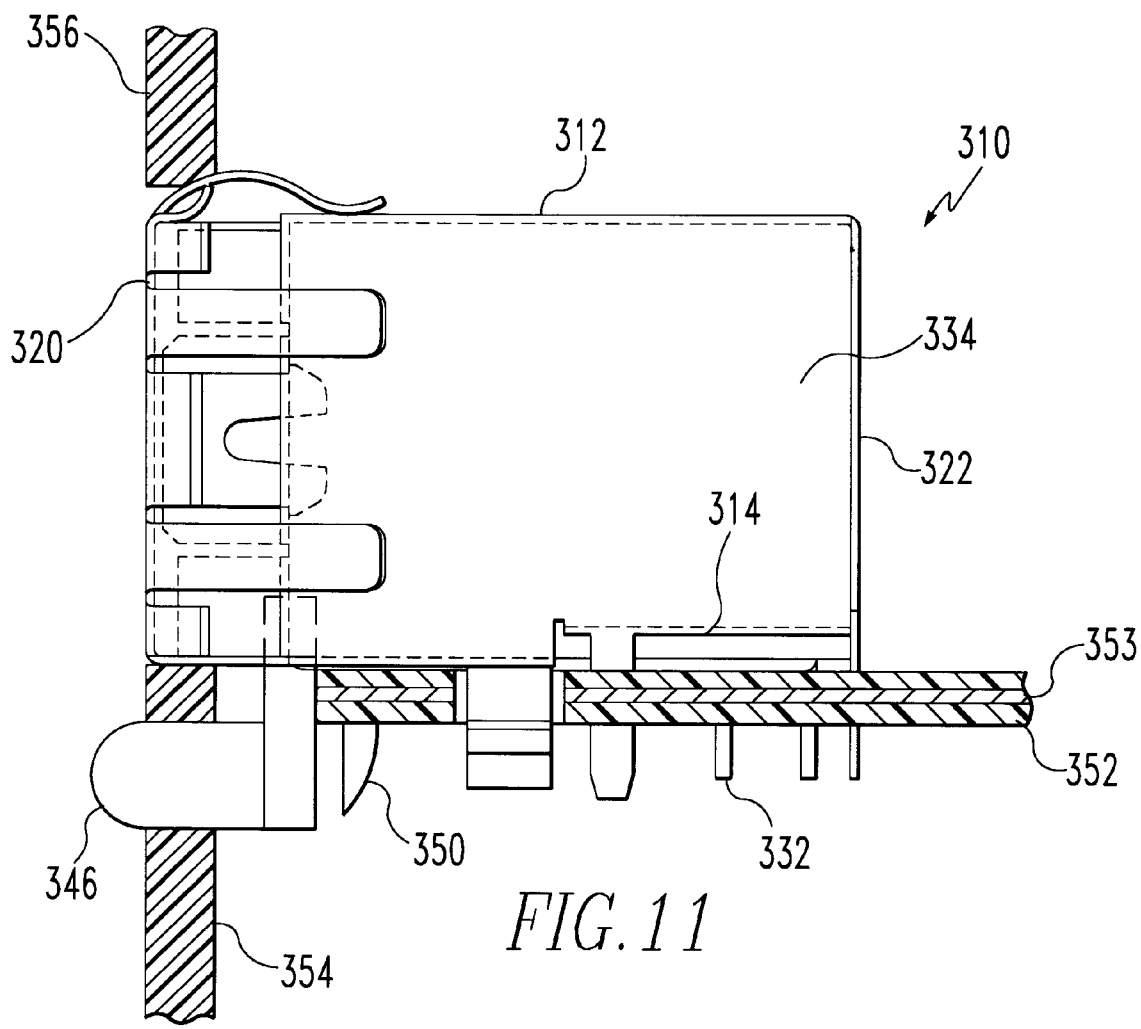
FIG. 11 is a end view of an assembly made up the modular gang jack shown in FIG. 9, a PCB and an LED.

Referring to FIGS. 9–11, a modular jack representing another preferred embodiment is shown generally at numeral 310. This modular jack has an insulative housing which includes a top wall 312, a bottom wall 314, lateral walls 316 and 318, a front side 320 and a rear side 322. From the open front side 320 there is an insert receiving cavity 324 where the jack may be engaged by an insert. Under a shield on the top wall there are a number of conductor receiving grooves (not shown) which receive conductors such as wires 230 and 232. These wires extend upwardly parallel to the rear side then extend horizontally in the grooves in the top wall and from the front of the top wall extend downwardly and rearwardly into the cavity 324. The modular jack also includes a metallic shield 334 and mounting pins as at pins 326 and 328. The panel section 354 and 356 are positioned below and above the jack, and the lenses as at lens 344 and 346 are mounted in apertures in the lower panel section 354. LED 350 is mounted on the bottom surface of PCB 352. As is shown particularly in FIG. 11, lens 346 is suspended from the PCB 352. Light from LED 350 is refracted or conducted by lens 346 so that the user is apprised of some status of the jack.

Figure 12:
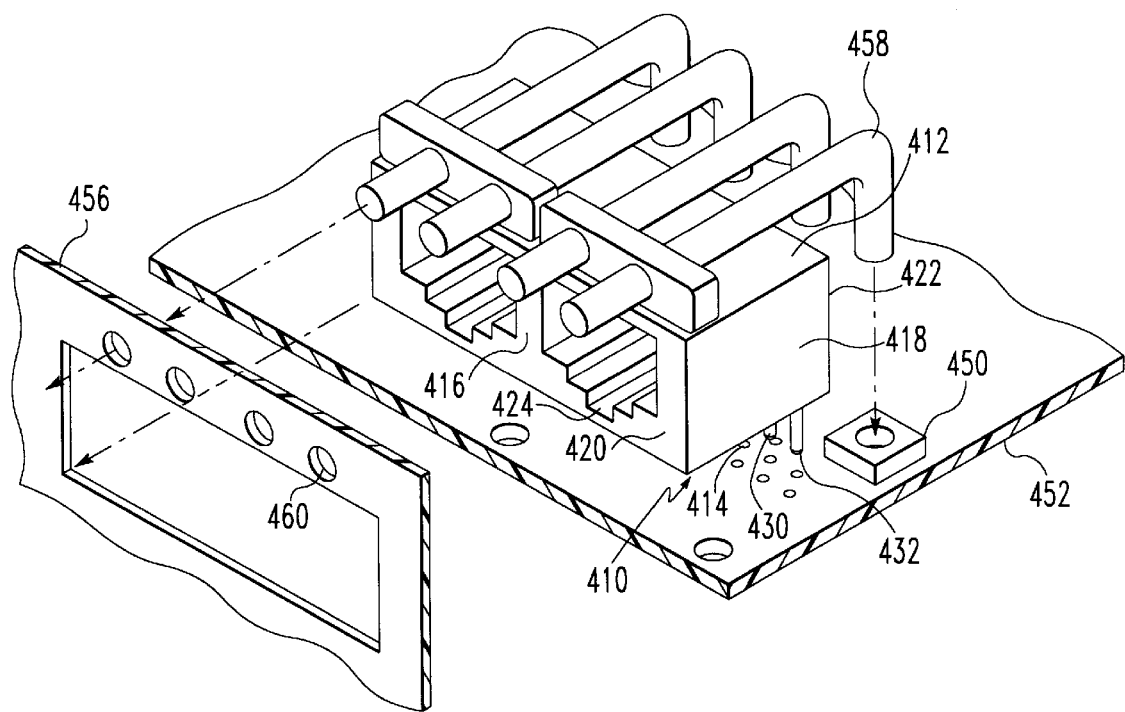
FIG. 12 is an exploded perspective view of an assembly representing still another preferred embodiment of the present invention.

Referring to FIG. 12, a modular jack is shown generally at numeral 410. This modular jack has an insulative housing which includes a top wall 412, a bottom wall 414, lateral walls 416 and 418, a front side 420 and a rear side 422. From the open front side 420 there is an insert receiving cavity 424 where the jack may be engaged. On the top wall beneath a shield 434 there are a number of conductor receiving grooves (not shown) which receive conductors such as wires 430 and 432. These wires extend upwardly parallel to the rear side then extend horizontally in the grooves in the top wall and from the front of the top wall extend downwardly and rearwardly into the cavity 424. LED's such as LED 450 are mounted on PCB 452. The PCB also includes a conventional metallized medial shield plane (not shown) The LED's are engaged by light pipes as at light pipes 458 which extends upwardly then horizontally to engage apertures as at aperture 460 in panel 436.

It will be appreciated that a modular jack has been described which makes use of an LED which, because it is mounted on the PCB rather than being integral with the jack itself, signals provided to the LED will be relatively remote from those provided to the connector so that there will be relatively little interference with the connector signals.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An assembly comprising:
   (a) a printed circuit board (PCB) having opposed first and second planar surfaces;
   (b) a jack fixed to the first planar surface of the PCB and comprising an insulative housing comprising first and second longitudinal walls positioned such that said second longitudinal wall is positioned over said first longitudinal wall in spaced parallel relation and at least one pair of lateral walls is interposed between the first and second longitudinal walls to form at least one traverse plug receiving cavity extending from a substantially open front side of said jack to a rear side of said jack;
   (c) a light emitting means fixed to the second planar surface of the PCB; and
   (d) means for conducting light from the light emitting means to a position adjacent the front side of the jack.

2. The assembly of claim 1 wherein the means for conducting light includes a light diffraction means.

3. The assembly of claim 1 wherein the means for conducting light includes a light pipe.

4. The assembly of claim 1 where there is a cavity interposed between the first longitudinal wall of the jack and the first surface of the PCB adjacent the front side of the jack.

5. The assembly of claim 4 wherein a light pipe connects the light emitting means and the cavity positioned between the jack and the PCB.

6. The assembly of claim 5 wherein the cavity between the jack and the PCB has a front side and the light diffraction means is positioned at said front side of said cavity.

7. The assembly of claim 4 wherein the light emitting is fixed to the second side of the PCB and the cavity between the jack and the PCB has a front side and a light conducting means is positioned at said front side of said cavity.

8. The assembly of claim 1 wherein the light emitting means is fixed to the second side of the board and the front side of the jack is superimposed over a panel and there is an aperture in said panel and the means for conducting light extends from the light emitting means to said aperture.

9. The assembly of claim 1 wherein the light emitting means is a light emitting diode (LED).

10. The assembly of claim 2 wherein the light diffraction means is a lens.

11. The assembly of claim 2 wherein the light diffraction means is positioned adjacent the front side of the jack.

12. A jack comprising an exterior metallic shielding covering an insulative housing comprising first and second longitudinal walls positioned such that said second longitudinal wall is positioned over said first longitudinal wall in spaced parallel relation and at least one pair of lateral walls is interposed between the first and second longitudinal walls to form at least one traverse plug receiving cavity extending from a substantially open front side of said jack to a rear side of said jack and a second minor cavity formed in said first longitudinal wall which is adapted for receiving a light emitting means and which has a front end and said front end is at least partially covered with a light diffraction means.

13. The jack of claim 12 wherein the light emitting means is a light emitting diode (LED).

14. The jack of claim 13 wherein the light diffraction means is a lens.

* * * * *